United States Patent

(12) United States Patent
Devlin

(10) Patent No.: US 9,146,020 B2
(45) Date of Patent: Sep. 29, 2015

(54) MODULAR LAMP CONTROLLER

(75) Inventor: Thomas E. Devlin, Winchester, MA (US)

(73) Assignee: LOTO LIGHTING LLC, Somerville, MA (US)

( * ) Notice: Subject to any disclaimer, the term of this patent is extended or adjusted under 35 U.S.C. 154(b) by 164 days.

(21) Appl. No.: 14/009,192

(22) PCT Filed: Mar. 27, 2012

(86) PCT No.: PCT/US2012/030717
§ 371 (c)(1),
(2), (4) Date: Nov. 5, 2013

(87) PCT Pub. No.: WO2012/135202
PCT Pub. Date: Oct. 4, 2012

(65) Prior Publication Data
US 2014/0056010 A1    Feb. 27, 2014

Related U.S. Application Data

(60) Provisional application No. 61/516,269, filed on Apr. 1, 2011.

(51) Int. Cl.
| | |
|---|---|
| *F21S 8/08* | (2006.01) |
| *F21V 14/02* | (2006.01) |
| *F21S 8/00* | (2006.01) |
| *F21V 21/15* | (2006.01) |
| *F21V 23/04* | (2006.01) |
| *H05B 37/02* | (2006.01) |
| *H05K 7/06* | (2006.01) |

(52) U.S. Cl.
CPC ............... *F21V 14/02* (2013.01); *F21S 8/038* (2013.01); *F21V 21/15* (2013.01); *F21V 23/0435* (2013.01); *H05B 37/0272* (2013.01); *H05K 7/06* (2013.01)

(58) Field of Classification Search
CPC .................................. F21V 21/14; F21V 21/30
USPC ......................................................... 362/418
See application file for complete search history.

(56) References Cited

U.S. PATENT DOCUMENTS

| | | | | |
|---|---|---|---|---|
| 4,608,763 | A * | 9/1986 | Manns et al. .................... | 33/561 |
| 6,655,817 | B2 | 12/2003 | Devlin et al. | |
| 6,794,830 | B2 | 9/2004 | Lansing et al. | |
| 7,764,162 | B2 | 7/2010 | Cash et al. | |
| 2005/0231134 | A1* | 10/2005 | Sid ................................ | 315/294 |

(Continued)

OTHER PUBLICATIONS

Devlin, "Lighting for the Home—Floor Lamps Do the Job," Enzine Articles, Feb. 26, 2010.

*Primary Examiner* — Evan Dzierzynski
(74) *Attorney, Agent, or Firm* — Occhiuti & Rohlicek LLP

(57) ABSTRACT

A modular controller for a lamp allows for the easy addition of remote control to multiple lamp fixture designs. The controller housing protects circuitry from shorts and has a window included for receiving remote control signals. The window is detachable and can be re-oriented relative to the controller housing to accommodate different lamp fixture designs. The position of the sensors within the controller housing can also be reconfigured, and it is also possible to connect external sensors to the controller for situations where sensors must be placed in a tight space. In some embodiments, the lamp power supply is incorporated within the modular controller, saving space and cost, and allowing for dimming of individual lamps.

6 Claims, 6 Drawing Sheets

(56) References Cited

U.S. PATENT DOCUMENTS

2005/0243549 A1  11/2005  Ruston
2006/0278816 A1  12/2006  Booty
2010/0066267 A1   3/2010  Meyer

* cited by examiner

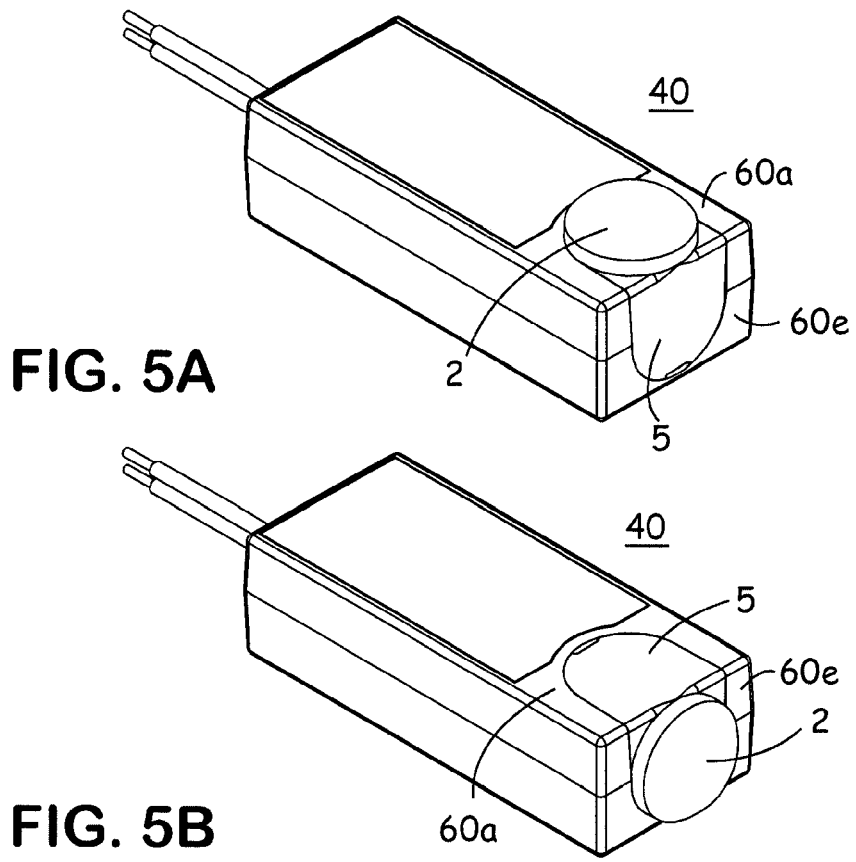
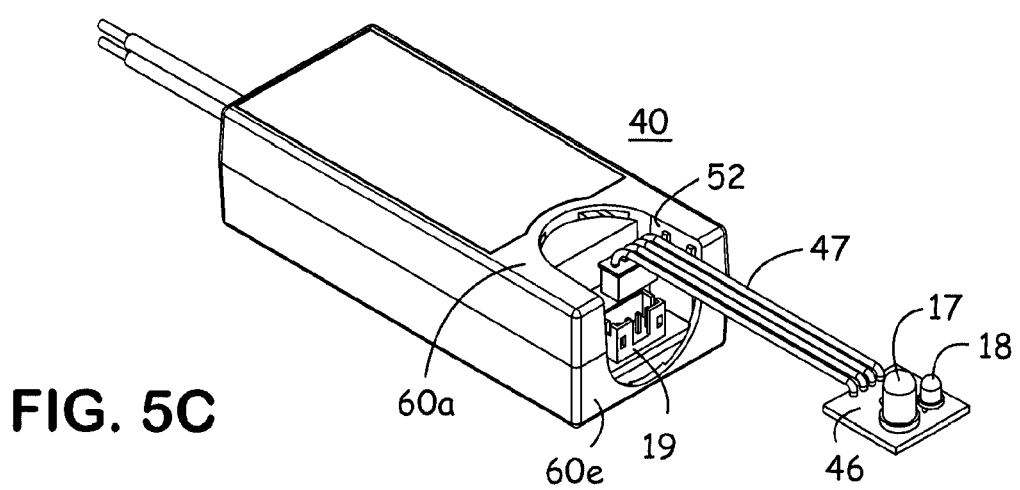

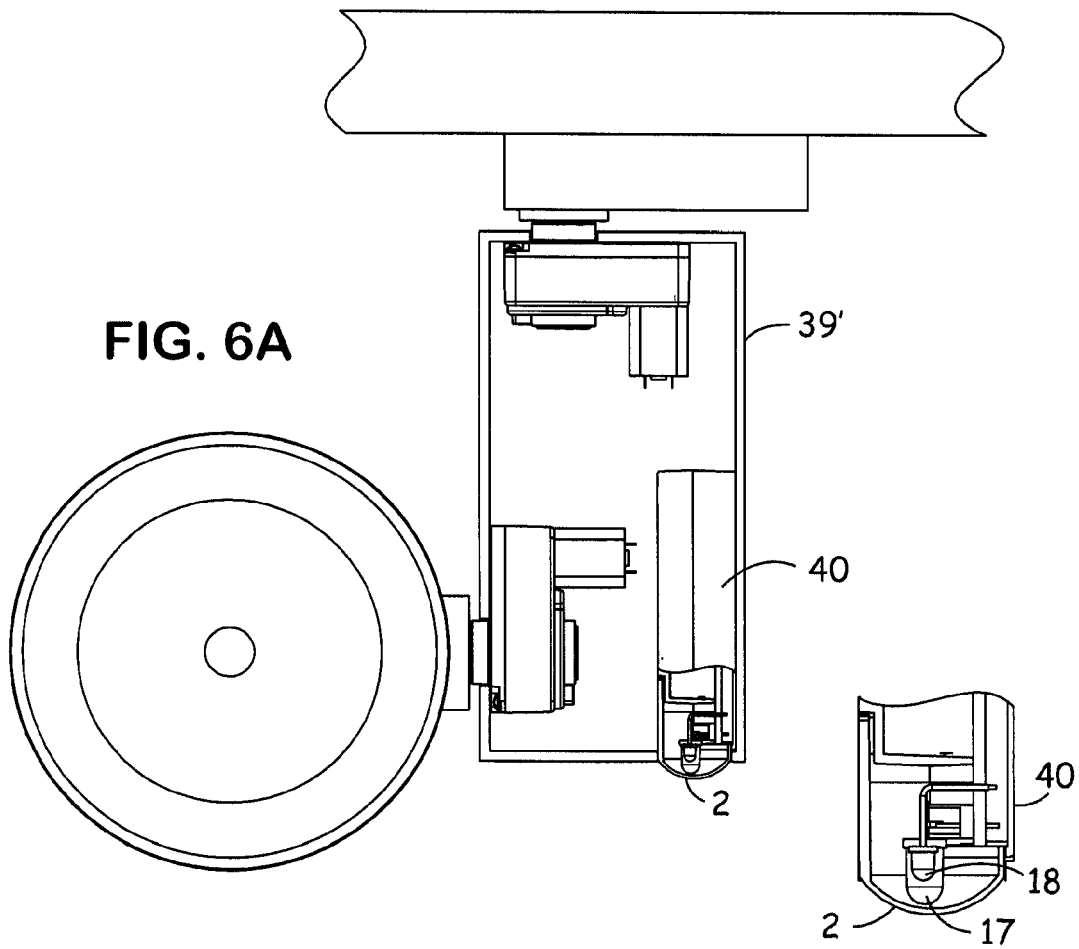
FIG. 6A
FIG. 6B
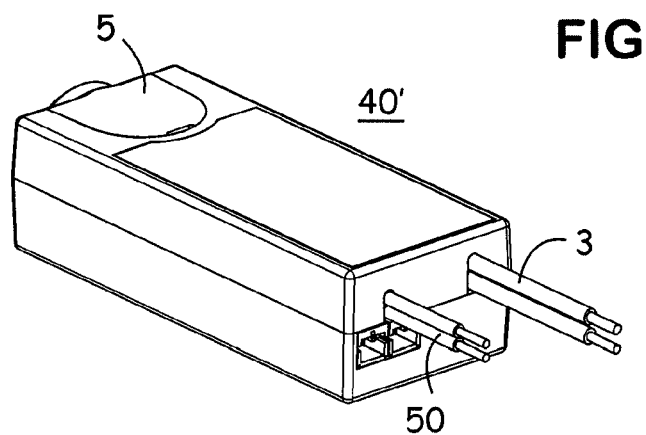
FIG. 7

MODULAR LAMP CONTROLLER

CROSS-REFERENCE TO RELATED APPLICATIONS

The present application is a National Stage of International Application No. PCT/US2012/030717, filed Mar. 27, 2012, which claims the priority of U.S. Provisional patent application No. 61/516,269, filed on Apr. 1, 2011. The contents of the prior applications are hereby incorporated by reference in their entirety.

BACKGROUND

Remote controlled lighting systems used to control lamp position and/or brightness have wide application including use in entertainment settings, surgical settings, and retail settings. Some remote-controlled light fixtures may include a lamp secured to a track via a light fixture housing. The fixture housing may contain a lamp power supply, motors for positioning the lamp, and control electronics. A hand-held remote makes it convenient to control the lamp without the need for ladders.

However, the mechanisms and control required to enable remote control are not standard features of most light fixtures, and most manufacturers are not prepared to add remote control to their lamps. In some cases, barriers to manufacturers making such an addition include the need to invest in the re-design of light fixtures to include the control electronics and mechanisms required for remote control.

SUMMARY

In some aspects, a control module is provided. The control module is for controlling a position of a lamp, the lamp being moved between positions by a motor. The control module includes a housing including sidewalls, at least one of the sidewalls including an opening. The control module includes a window in the opening, the window being selectively removable from the housing and connectable to the housing in a plurality of orientations. The control module also includes a sensor disposed within the housing so as to face the window, the sensor configured to receive a signal provided from outside the housing, and a controller disposed in the housing, the controller being configured to receive a signal output from the sensor, and to reposition the lamp by outputting a signal to the motor.

The control module may include one or more of the following features: The window is selectively removable from the housing and connectable to the housing in a plurality of orientations in such a way that the opening is completely covered regardless of window orientation. When the window is in a first orientation relative to the housing, the window resides within the opening within a first one of the sidewalls, and when the window is in a second orientation relative to the housing, the window resides within the opening within a second one of the sidewalls. The window includes a flange, and when the window resides within the opening within the first one of the sidewalls, the flange resides within the opening in the second one of the sidewalls, and when the window resides within the opening within a second one of the sidewalls, the flange resides within the opening in the first one of the sidewalls. The window is dome shaped. The window is optically translucent. The window protrudes from an outer surface of the housing. The sensor is repositionable relative to the housing between a first position in which a detecting surface of the sensor is parallel to a first one of the sidewalls, and a second position in which the detecting surface of the sensor is parallel to a second one of the sidewalls. The control module further includes a power supply disposed in the housing, wherein the power supply is configured to receive alternating current power and to provide a direct current at voltage that is reduced relative to the received power, the controller and power supply are separated from the motor and lamp by the sidewalls, and the power supply provides power to the controller and to at least one of the lamp and the motor.

In some aspects, a control module is provided. The control module is for controlling a position of a lamp, the lamp being moved between positions by a motor. The control module includes a housing including sidewalls, at least one of the sidewalls including an opening, and a sensor disposed within the opening, the sensor configured to receive a signal provided from outside the housing and being repositionable relative to the housing. The control module also includes a controller disposed in the housing, the controller configured to receive a signal output from the sensor, and to reposition the lamp by outputting a signal to the motor.

The control module may include one or more of the following features: The sensor is repositionable relative to the housing between a first position in which a detecting surface of the sensor is parallel to a first one of the sidewalls, and a second position in which the detecting surface of the sensor is parallel to a second one of the sidewalls. The sensor is further movable relative to the housing to a third position in which the detecting face of the sensor faces away from an outer surface of one of the sidewalls and leads connecting the sensor to the controller reside within the opening. The control module further comprises a window, and when the sensor is in the first position, the window resides within the opening and is parallel to a first one of the sidewalls, and when the sensor is in the second position, the window resides within the opening and is parallel to a second one of the sidewalls. The sensor comprises an optical sensor. The control module further comprises a first printed circuit board, and the controller is mounted to the first printed circuit board, and wherein the sensor comprises an optical sensor mounted to a second printed circuit board, and the second printed circuit board is detachably electrically connected to the first printed circuit board via a connector. The control module further comprises a power supply disposed in the housing, wherein the power supply is configured to receive alternating current power and to provide a direct current at voltage that is reduced relative to the received power, the controller and power supply are separated from the motor and lamp by the sidewalls, and the power supply provides power to the controller and to at least one of the lamp and the motor.

In some aspects, a control module is provided. The control module is for controlling a position of a lamp, the lamp being moved between positions by a motor. The control module includes a controller configured to output a signal to the motor, and a power supply for providing power to the controller and to the lamp and the motor, the power supply configured to receive alternating current power and to provide a direct current at voltage that is reduced relative to the received alternating current power. The control module further comprises a housing within which the controller and power supply are disposed and configured to separate the controller and power supply from the motor and lamp.

The control module may include one or more of the following features: The housing includes an opening; and a sensor is disposed within the opening, the sensor configured to receive a signal provided from outside the housing, and to be repositionable relative to the housing. The control module further comprises a window in the housing, the window being selectively removable from the housing and connectable to the housing in a plurality of orientations.

In some aspects, a lighting and control system is provided that includes a light fixture including a fixture housing and a lamp supported on the fixture housing, and a motor disposed in the fixture housing and connected to the lamp, the motor configured to move the lamp between different positions. The system further includes a control module for controlling a position of the lamp. The control module includes a housing, a window in the housing, the window being selectively removable from the module housing and connectable to the module housing in a plurality of orientations. The control module further includes a sensor disposed within the housing so as to face the window, the sensor configured to receive a signal provided from outside the housing, and a controller disposed in the housing, the controller being configured to receive a signal output from the sensor, and to reposition the lamp by outputting a signal to the motor.

Among other advantages, the control module provides the control electronics required for achieving a remote control lamp in a modular form that is flexible to use and convenient for installation by manufacturers. The control module includes all the features that are required to add remote control features to a light fixture housing.

Furthermore, the control module can be physically reconfigured so that it can work in many different lamp designs having various geometries. By providing a single, reconfigurable control module that permits remote control, a manufacturer can stock a single part that will work in many different light fixtures, permitting the manufacturer to minimize stock of parts and reduce costs.

Further advantageously, the control module is enclosed within a module housing. The module housing is an important feature of the control module since it protects the control board, including its components and circuitry from forming an electrical short circuit with other parts of the light fixture such as the light fixture housing or motors. In addition, by providing the control functions within a module housing, the module as a unit can be fully evaluated and safety approved by government agencies, streamlining implementation of the control module into a lighting fixture design.

Still further advantageously, the control module includes a housing for control electronics and power supply that has a reconfigurable window for receiving laser and control signals from a transmitter. The window can be detached from an opening in the housing, and replaced within the opening in a different orientation relative to the housing. The window is sized and shaped to completely fill the opening regardless of orientation. An optical sensor and an indicator lamp are disposed in the window, and thus may be repositioned relative to the housing to correspond to the orientation of the window. The reconfigurability of the window and sensor relative to the housing is convenient because it allow a manufacture to arrange one module to fit in many different light fixtures. For example, sometimes housings are large and square to accommodate a large power supply such as metal halide, and sometimes they are very small because the lamp will run on mains power, so there is no lamp power supply. In some configurations, for example when the window is on the end of the control module rather than the side, the result is a slimmer design.

In addition, the window not only passes optical signals (such as laser light), it is also functions to pass radio frequency control signals into the housing. This is critical for use in light fixture housings that are formed of materials that block radio signals. In these cases, to enable reception, the control module is positioned within the light fixture with the module window within an opening in the light fixture. The window is relatively small, and is preferred to an unsightly external antenna. In some embodiment, the window is optically translucent. For example it may have a frosted surface that will scatter laser light that hits the window at an angle, aiding detection by the optical sensor.

The frosted surface also scatters light emitted from an "on" indicator lamp disposed within the housing that indicates that the lamp is ready for control. The scattering makes the light more uniformly visible from a variety of angles.

In some embodiments, the control module receives alternating current from mains power, possibly through a track, which powers a power supply that drives the repositioning motor(s). In other embodiments, the control module could be powered by 12 VAC, which is often the voltage in pre-installed track systems. In these embodiments, the lamp is powered independently of the control module. In other embodiments, the modular controller includes a power supply that will drive the lamp in addition to positioning motors. This configuration saves money and space, and is particularly practical with switching power supplies used for LED lamps, which are small and create less heat. With this power configuration, it is also an option to add individual controlled dimming to the modular controller.

Advantageously, a small external sensor assembly can be included in the control module. The external sensor assembly includes only the sensor and indicator lamp, and is connected to the control board of the control module via leads passing through the housing. This is helpful when the location for the window within the light fixture is in a very tight and at a location that is remote relative to the control module. In some cases, the optical sensor and indicator lamp that are directly connected to the control board of the control module are snipped off, and the external sensor assembly would be connected to the control board of the control module via a connector provided for that purpose. Most likely, a custom window would be created by the manufacturer.

Modes for carrying out the present invention are explained below by reference to an embodiment of the present invention shown in the attached drawings. The abovementioned object, other objects, characteristics and advantages of the present invention will become apparent from the detailed description of the embodiment of the invention presented below in conjunction with the attached drawings.

BRIEF DESCRIPTION OF THE DRAWINGS

FIG. 5A is a front perspective view of the control module with the window in a first position relative to the module housing.

FIG. 5B is a front perspective view of the control module with the window in a second position relative to the module housing.

FIG. 5C is a front perspective view of the control module with the window removed and including a remote sensor assembly.

FIG. 6A is a sectional view of another motorized lamp fixture including the control module of FIG. 2 within the lamp fixture.

FIG. 6B is a detail view of a portion of the control module of FIG. 2 configured as shown in FIG. 6A.

FIG. 7 is a rear perspective view of another embodiment of the control module.

DETAILED DESCRIPTION

Figure 1:
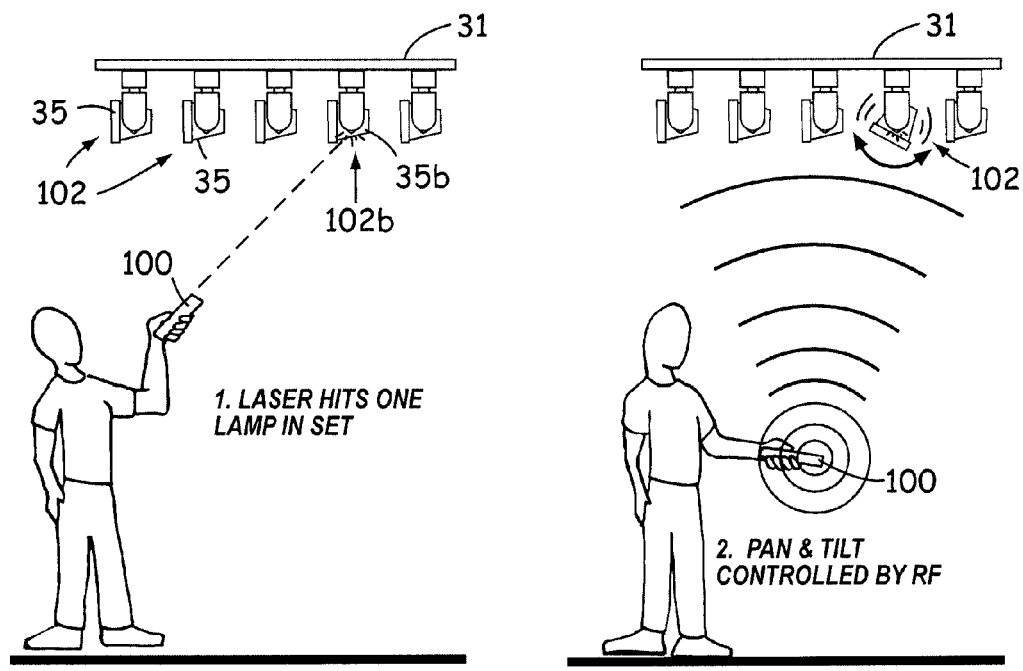
FIG. 1 illustrates use of a remote to select a light fixture and to a remotely control the brightness, position, and/or orientation of a lamp.

Referring to FIG. 1, a system for remotely controlling the brightness, position, and/or orientation of a single light fixture, or group of light fixtures, includes a hand-held remote control transmitter 100 and remote-controlled light fixtures 102. The light fixtures 102 used for the purposes of this description are mounted in a track 31, but fixture mounted, wall mounted, or table top devices could be used equally well in the system. The light fixtures 102 can be controlled either individually or as a group. A control module 40 is provided in each lamp fixture 102. The control module 40 is configured to receive signals from the remote control transmitter 100, and to control the position of a lamp 35 supported on the light fixture 102, as discussed further below. For individual control, the remote control transmitter 100 is pointed at the selected light fixture 102b, and a select button is pressed, sending out a directional signal such as a laser. An indicator lamp on the selected light fixture 102b lights to show that the module is ready to accept omni-directional remote control commands. In this condition, it is no longer necessary to point the remote control at the lamp fixture to control it. This allows the user to concentrate on the light field emitted by the lamp 35 during positioning, rather than aiming the remote control transmitter 100.

Figure 2:
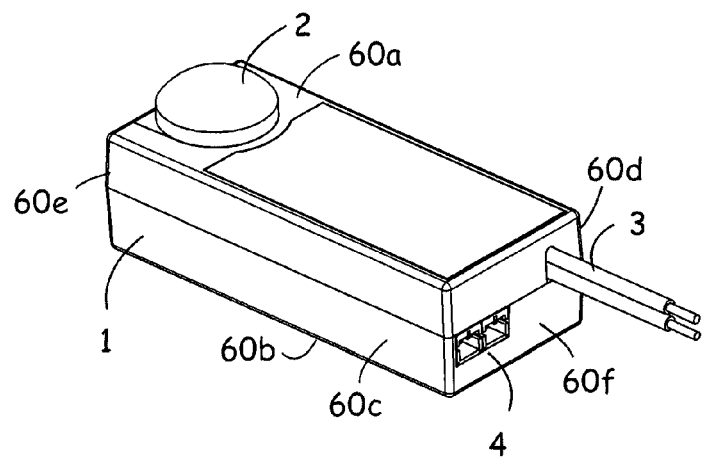
FIG. 2 is a rear isometric view of the control module.
Figure 3:
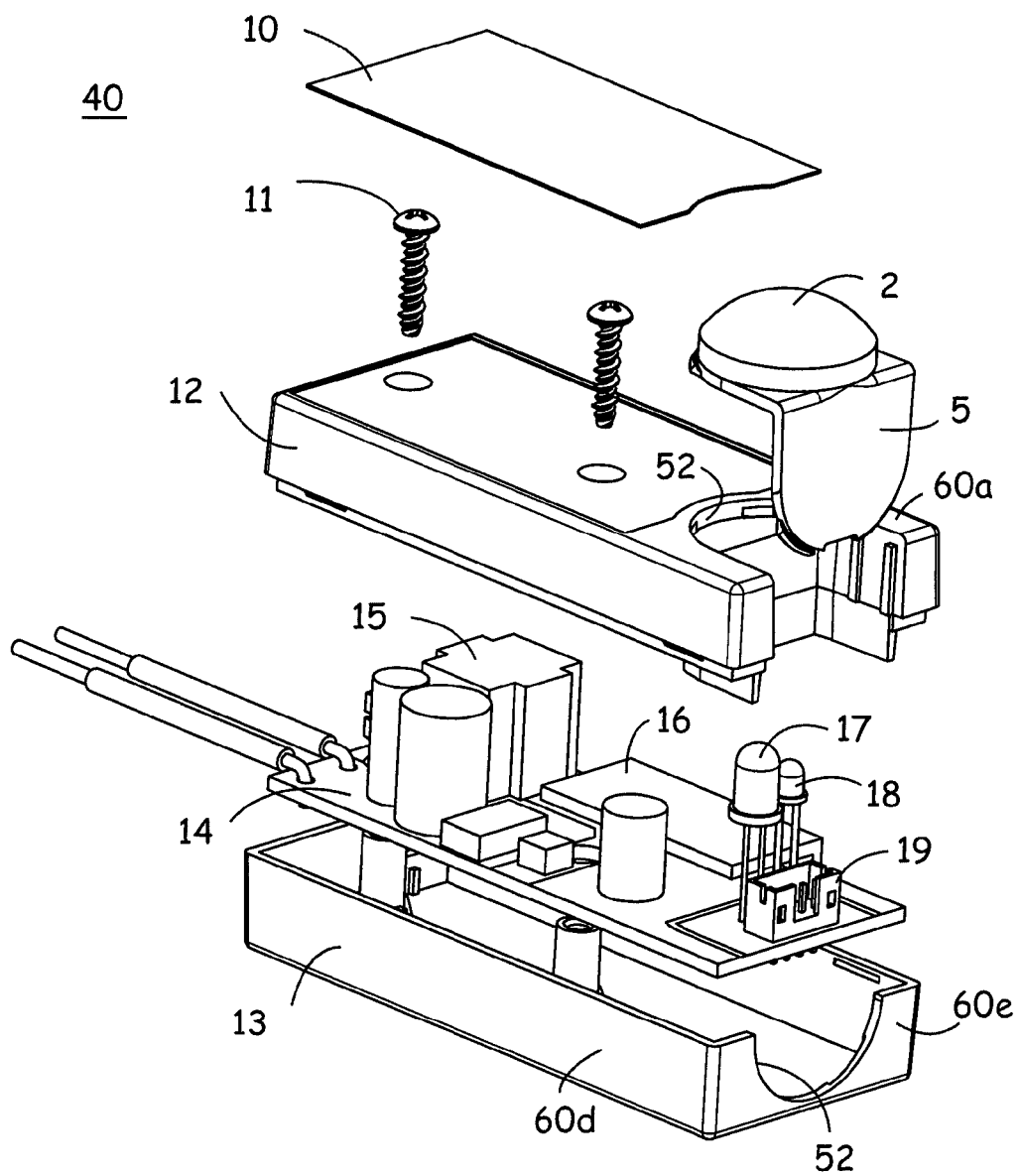
FIG. 3 is an exploded front perspective view of the control module of FIG. 2.

Referring to FIGS. 2 and 3, the control module includes a module housing 1. The module housing 1 is a rectangular, clam-shell housing including a top half 12 and a bottom half 13 held together by screws 11. In some embodiments, the screws are covered by a label 10. The top and bottom halves 12, 13 provide sidewalls 60 that surround a control board 14 that is supported within the module housing 1. In the illustrated embodiment, the sidewalls 60 include a top 60a, a bottom 60b opposed to the top 60a, opposed lateral sides 60c, 60d that join the top 60a to the bottom 60b along the side edges thereof, a front end 60e and a rear end 60f opposed to the front end 60e. The front and rear ends 60e, 60f join the top 60a to the bottom 60b along the end edges thereof. Here, references to direction, including "top", "bottom", "lateral", "front end" and "rear end", are made with respect to the orientation shown in FIG. 3 for purposes of description of the embodiment, and are not intended to be limiting.

An opening 52 is formed in the module housing 1. The opening 52 extends within the top 60a inward from an edge of the top 60a adjoining the front end 60e. In addition, the opening 52 also extends within the front end 60e inward from an edge of the front end 60e adjoining the top 60a. The opening 52 forms a generally U-shaped cut-out in each of the top 60a and front end 60e.

The housing 1 also includes a window 2 that snap-fits within in the opening 52. In the illustrated embodiment, the window 2 is round and dome shaped such that it protrudes outward relative to outer surface of the sidewall 60. In addition, the window 2 is translucent. Translucence can be achieved, for example, by forming the window 2 of a material containing a light-scattering matrix of particles, or by providing the outer and/or inner surface of the window with a texture or frost. By using a translucent window 2, the reception of laser is improved due to light scattering. In particular, the scattering will send a misdirected beam in many directions, increasing the chance for beam to be received by the photodiode 17. Frosting of the window 2 has the added benefit of hiding the electronics from view.

In the illustrated embodiment, the window 2 includes a flange portion 5 that extends from a periphery of the window 2 in a direction perpendicular to a plane defined by the window 2. The flange portion 5 has a peripheral shape that is similar to that of the window, that is, it has a U-shape. As a result, the window 2 is L-shaped in cross-section. The window 2 can be detached from the module housing 1 and reconnected to the module housing 1 in a plurality of orientations. By providing the window 2 with the flange portion 5 that has the same peripheral shape, when the window 2 is removed, flipped to another orientation, and reconnected to the housing 1, the window 2 still covers the entire opening 52.

The control board 14 includes a microcontroller 42, a motor driver 43 that is controlled by the microcontroller 42, and a power supply 15 that provides power to the microcontroller 42 and motor driver 43. The control board 14 includes a radio receiver 16, a photodiode 17, and an indicator lamp 18 for indicating that the control module 40 is active. In some embodiments, the indicator lamp 18 is an LED. The control board 14 also includes a connector 19 configured to receive a corresponding connector of an external sensor assembly 46, and provide an electrical connection between the external sensor assembly 46 and the microcontroller 42. In FIG. 3, the photodiode 17 and LED 18 are arranged in a vertical orientation.

Figure 4:
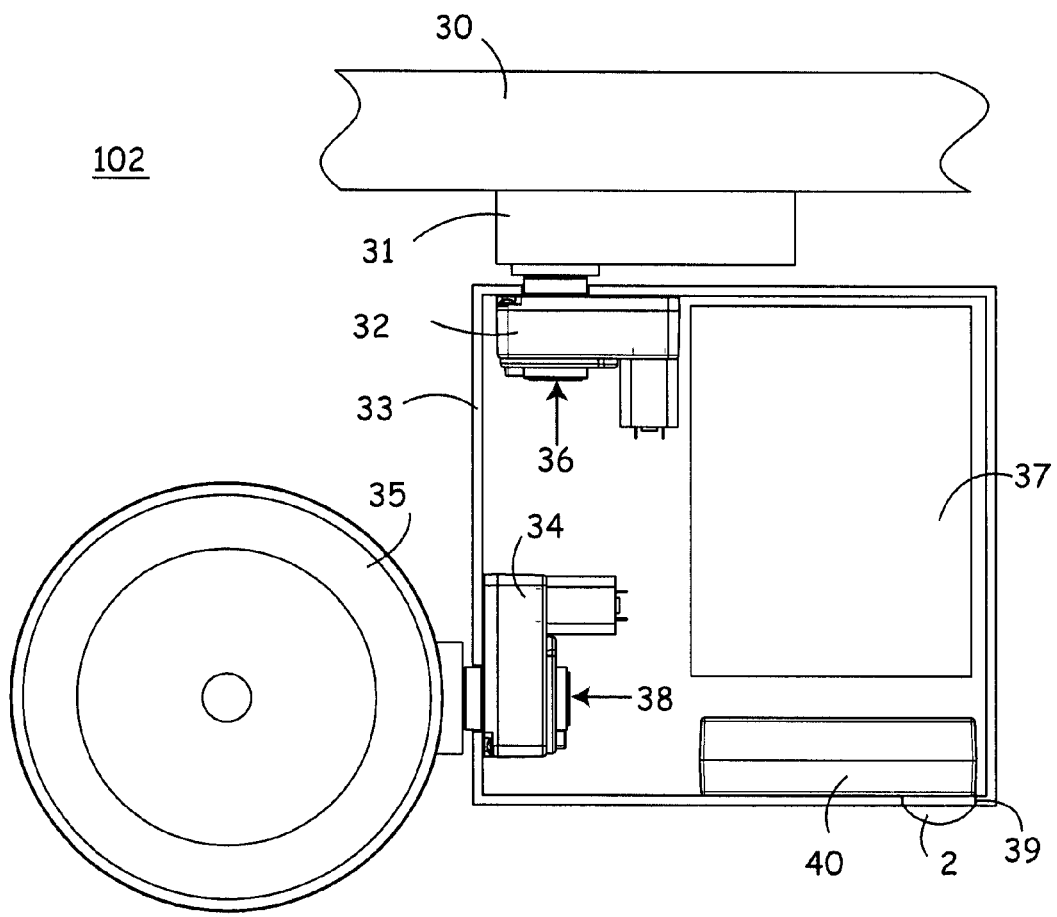
FIG. 4 is a sectional view of a motorized lamp fixture including the control module of FIG. 2 within the lamp fixture.
Figure 8A:
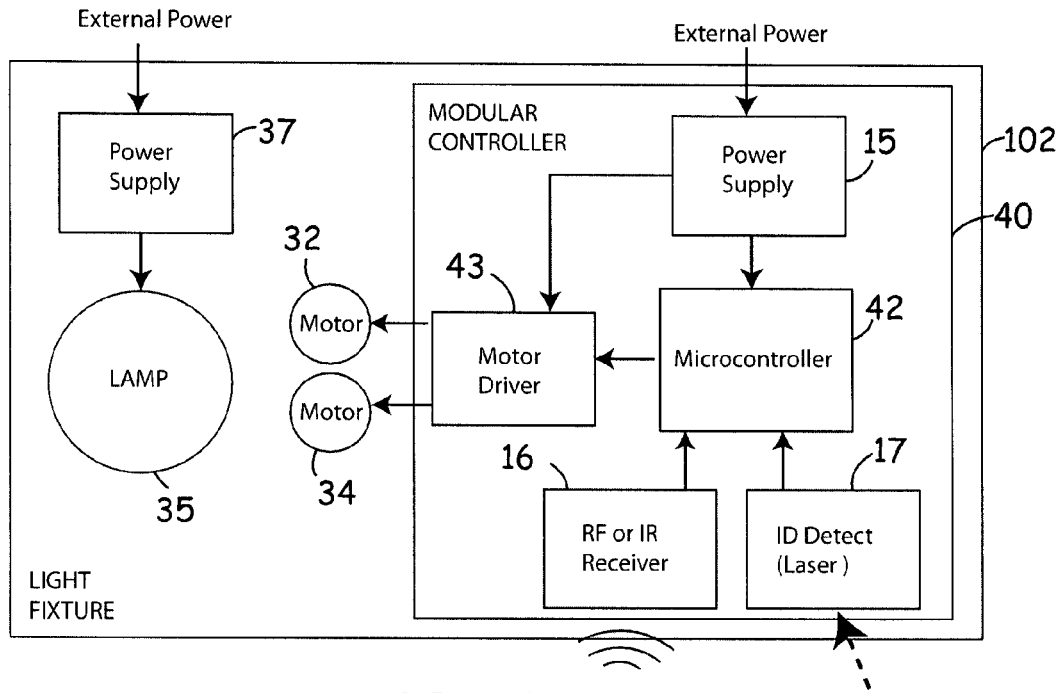
FIG. 8A is a block functional diagram for the control module of FIG. 2.

Referring to FIG. 8A, the control module 40 is powered using alternating current power from the power grid (e.g., mains power). Mains power enters the control module housing 1 via two wires 3 and supplies the power supply 15, which in turn, provides direct current at voltage that is reduced relative to the mains power. In some embodiments, the power supply 15 provides 5 V DC. In addition, the control module 4 has two output connectors 4 for connection to lines that permit selective powering and driving of lamp-positioning motors 32, 34 (the motors are shown in FIG. 4). The lamp 35 is powered separately from the modular controller 40 via a lamp power supply 37.

In use, an ID Laser detect circuit (not shown) provided in the microcontroller 42 would be activated from a directional laser signal transmitted from the hand-held remote control transmitter 100, enabling the microcontroller 42 to start following commands from the radio or infrared receiver. Based on those commands, the microcontroller 42 controls a motor driver circuit 43 to direct the lamp-positioning motors 32, 34.

Referring to FIG. 4, the modular controller 40 is a self-contained, modular unit that can simply be placed inside a light fixture 102. In FIG. 4, wiring and other ancillary structures have been excluded for clarity. The light fixture 102 is mounted to a track 30 via a track mounting 31, and includes a fixture housing 39. A lamp 35 is supported on the fixture housing 39, and is connected to, and rotated by, a tilt motor 34 disposed within the fixture housing 39. Mains power is supplied to the light fixture 102 through the input axis 36 of a pan motor 32, which is also disposed within the fixture housing 39. The input axis 36 is hollow for the purpose of receiving wires, and mains power lines pass through pan motor 32 to the control module 40. A separate lamp power supply 37 is included in the light fixture housing 39 that powers the lamp 35 via wires passing through the tilt motor rotational axis 38.

The modular controller 40 is positioned within the light fixture 102 such that the window 2 protrudes through a hole formed in the fixture housing 39 for that purpose and allowing for the reception of signals. The modular controller 40 drives both the pan motor 32 and tilt motor 34.

Referring to FIG. 5A, the control module 40 can be physically reconfigured so that it can work in many different lamp designs. As a result, a manufacturer can stock a single part that will work in many different light fixtures, permitting the manufacturer to minimize stock of parts and reduce costs. In particular, a first physical configuration is illustrated in FIG. 5A, in which the window 2 is oriented within the opening 52 such that the flange portion 5 is received within the module housing front end 60*e*, and the window 2 is received within the module housing top 60*a*. In this configuration, the photodiode 17 and LED 18 are arranged within the housing 1 so as to face the window 2. In particular, the photodiode 17 and LED 18 are disposed within the opening 52 within the top 60*a*, and are oriented so that a detection surface of the sensor 17 is parallel to the top 60*a* and faces outward relative to the module housing 1.

Referring to FIG. 5B, in a second physical configuration of the control module 40, the window 2 is oriented within the opening 52 such that the flange portion 5 is received within the module housing top 60*a*, and the window 2 is received within the module housing front end 60*e*. In this configuration, the photodiode 17 and LED 18 are arranged within the housing 1 so as to face the window 2. In particular, the photodiode 17 and LED 18 are disposed within the opening 52 within the front end 60*e*, and are oriented so that a detection surface of the sensor 17 is parallel to the front end 60*e* and faces outward relative to the module housing 1. In some embodiments, repositioning of the photodiode 17 and LED 18 within the module housing 1 is achieved by bending the leads used to connect the photodiode 17 and LED 18 to the control board 14.

Regardless of whether the control module 40 is used in the first or second configuration, the window 2 is shaped such that the opening 52, including portions on the top 60*a* and on the front end 60*e*, is covered.

Referring to FIG. 5C, in a third physical configuration of the control module 40, the window removed from the opening 52. In this configuration, the photodiode 17 and LED 18 can be arranged within the housing 1 as described above for either of the first and second configuration. Alternatively, an external sensor assembly 46 that includes a photodiode 17 and LED 18 can be connected to the connector 19 of the control module 40 using leads 47 that pass through the opening 52. The third configuration including the external sensor assembly 46 is advantageous since it permits manufacturers to place their own window in a remote location. It also permits sensors to be place within a small space at a location remote from the control board 14, which is particularly useful for use in light fixtures of unusual geometries.

Referring to FIGS. 6A and 6B, the light fixture housing 39' can be made much smaller than the embodiment shown in FIG. 4 by providing the control module 40 in the second configuration among other modifications. When in the second configuration, the modular controller 40 is oriented with window 2 on the housing front end 60*e*, resulting in a module having a lower profile (FIG. 6A, in which wires are excluded for clarity). The photodiode 17 and LED 18 are bent from an orientation perpendicular to the control board 14 to and orientation generally parallel to the control board 14 to accommodate the window configuration (FIG. 6B).

Figure 8B:
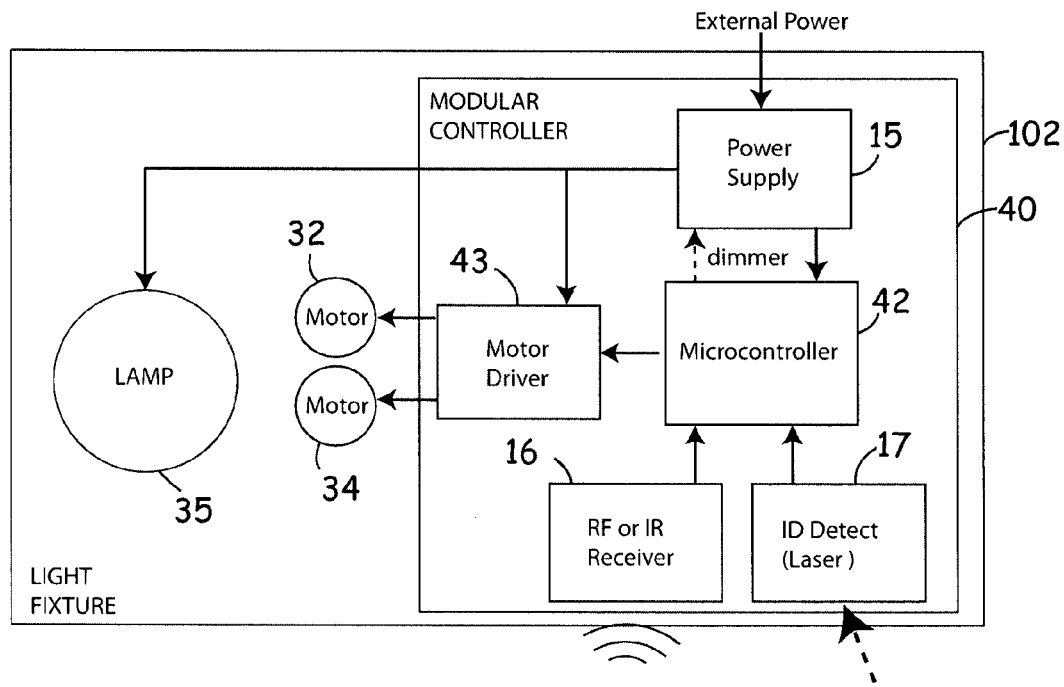
FIG. 8B is a block functional diagram for another embodiment of the control module.

Referring to FIG. 7 and FIG. 8B, a second modification to the light fixture 102 to reduce the size of the light fixture housing 39 includes removing the lamp power supply 37, and powering the lamp 35 using the power supply 15 of the control module 40. In order to minimize cost and size, and maximize power savings, it is much more efficient to have one power supply that drives the lamp 35 and the components/and or circuitry on the control board 14. To accomplish this, the modular controller 40 can be modified to further include power out wires 50 (FIG. 7) that connect the power supply 15 to the lamp 35. In some embodiments, the lamp 35 is a 12 volt halogen lamp. In other embodiments, the lamp 35 can be a light source that uses much less power, such as one employing one or more LEDs.

In this embodiment, the power supply 15 can be any type of supply including switching mode supply, or one configured to dim the lamp 35 when the mains supply is dimmed from a wall switch. With the lamp supplied by the power supply 15 on the control board 14, it will also be possible to dim the lamps individually from the microcontroller 42 using signals from the hand-held remote control transmitter 100.

Although the window 2 is illustrated here as round and dome shaped, the window is not limited to this configuration. For example, the window can be made in any convenient peripheral shape, and further may be planar or have an irregular thickness.

Moreover, other structures can be substituted for the window 2 described herein. For example, other embodiments could have knock-out panels for the window, or could use a window that allows reception in multiple axes.

Although the system and control module 40 described herein include a radio receiver 16, the control module 40 is not limited to this type of sensor, and the radio receiver 16 can be replaced using another type of sensor. For example, the radio receiver can be replaced by an infrared receiver. In addition, the photodiode 17 can be replaced by another type of laser or optical sensor such as phototransistor, or another type of optical sensor.

Although the control module 40 described herein includes an LED 18 that can be repositioned within the module housing, the module 40 is not limited to this configuration. For example, in some embodiments, a surface mount LED may be used that bathes light in all directions so that repositioning is not needed.

In addition, as discussed above with respect to FIG. 5C, the control module 40 described herein can be arranged in a third physical configuration in which the window 2 is removed from the opening 52, and an external sensor assembly 46 that includes a photodiode 17 and LED 18 is connected to the connector 19 of the control module 40 using leads 47 that pass through the opening 52. In some embodiments, however, the control module 40 may be manufactured without the connector 19, whereby only the first and second physical configurations would be available. In other embodiments, the control module 40 may be manufactured with the connector 19 and without the photodiode 17, LED 18 that are directly connected to the control board 14, whereby optical sensing is achieved via the external sensor assembly 46.

A selected illustrative embodiment of the invention is described above in some detail. It should be understood that only structures considered necessary for clarifying the present invention have been described herein. Other conventional structures, and those of ancillary and auxiliary components of the system, are assumed to be known and understood by those skilled in the art. Moreover, while a working example of the present invention has been described above, the present invention is not limited to the working example described above, but various design alterations may be carried out without departing from the present invention as set forth in the claims.

What is claimed is:

1. A control module for controlling a position of a lamp, the lamp being moved between positions by a motor, the control module comprising:
    a housing including a first sidewall and a second sidewall which are adjacent and which have a first opening and a second opening, respectively;
    a sensor fixedly disposed within the housing so as to face the first opening or the second opening, the sensor configured to receive a signal provided from outside the housing;
    a detachable window assembly having a translucent window portion through which the signal provided from outside the housing can pass and a flange portion which are interconnected at an angle relative to each other, the window assembly being selectively removable from the housing and connectable to the housing in a first position wherein the window portion covers the first opening and the flange portion covers the second opening and in a second position wherein the window portion covers the second opening and the flange portion covers the first opening; and
    a controller disposed in the housing, the controller being configured to receive a signal output from the sensor, and to reposition the lamp by outputting a signal to the motor.

2. The control module of claim 1, wherein the translucent window is dome shaped.

3. The control module of claim 1, wherein the window protrudes from an outer surface of the housing.

4. The control module of claim 1, wherein the sensor is repositionable relative to the housing between a first position in which a detecting surface of the sensor is parallel to a first one of the sidewalls, and
    a second position in which the detecting surface of the sensor is parallel to a second one of the sidewalls.

5. The control module of claim 1, further comprising a power supply disposed in the housing, wherein
    the power supply is configured to receive alternating current power and to provide a direct current at voltage that is reduced relative to the received power, the controller and power supply are separated from the motor and lamp by the sidewalls, and the power supply provides power to the controller and to at least one of the lamp and the motor.

6. The control module of claim 1 further comprising a first printed circuit board, and the controller is mounted to the first printed circuit board, and wherein the sensor comprises an optical sensor mounted to a second printed circuit board, and the second printed circuit board is detachably electrically connected to the first printed circuit board via a connector and used external to the control module.

* * * * *